(12) United States Patent
Markoya (10) Patent No.: US 7,838,310 B2
(45) Date of Patent: Nov. 23, 2010

(54) TUNABLE ALIGNMENT GEOMETRY (75) Inventor: Louis J. Markoya, Sandy Hook, CT (US)

(73) Assignee: ASML Holding N.V.

( * ) Notice: Subject to any disclaimer, the term of this patent is extended or adjusted under 35 U.S.C. 154(b) by 0 days.

(21) Appl. No.: 12/423,463

(22) Filed: Apr. 14, 2009

(65) Prior Publication Data
US 2009/0201505 A1   Aug. 13, 2009

Related U.S. Application Data (62) Division of application No. 11/516,748, filed on Sep. 7, 2006, now Pat. No. 7,534,637, which is a division of application No. 10/696,355, filed on Oct. 30, 2003, now Pat. No. 7,112,890.

(51) Int. Cl.
H01L 21/00 (2006.01)
H01L 21/66 (2006.01)
H01L 21/76 (2006.01)
G01R 31/26 (2006.01)
G01B 11/00 (2006.01)

(52) U.S. Cl. ............... 438/7; 438/16; 438/401; 356/399; 257/E21.53; 257/E21.211; 257/E33.066

(58) Field of Classification Search ............... 438/401, 438/7, 16; 356/399; 257/E21.211, E21.53, 257/E33.066, 7, 16, 401
See application file for complete search history.

(56) References Cited

U.S. PATENT DOCUMENTS

| 5,966,215 | A  | 10/1999 | Markoya et al. |
| 6,465,322 | B2 | 10/2002 | Ziger et al. |
| 6,486,954 | B1 | 11/2002 | Mieher et al. |
| 6,493,065 | B2 | 12/2002 | Ina et al. |
| 6,639,677 | B1 | 10/2003 | Ina et al. |
| 6,654,107 | B1 | 11/2003 | Watanabe et al. |
| 6,841,890 | B2 | 1/2005  | Fujimoto |
| 7,112,890 | B2 | 9/2006  | Markoya |
| 2001/0051441 | A1 | 12/2001 | Ziger et al. |
| 2003/0227625 | A1 | 12/2003 | Heisley et al. |
| 2004/0066517 | A1 | 4/2004  | Huang et al. |
| 2004/0099963 | A1 | 5/2004  | Holloway et al. |
| 2005/0096779 | A1 | 5/2005  | Markoya |

FOREIGN PATENT DOCUMENTS

JP      3-005753 A      1/1991

(Continued)

OTHER PUBLICATIONS

Decision of Rejection and Dismissal of Amendment for Japanese Patent Application No. 2004-318447, mailed May 27, 2008, 4 pgs.

(Continued)

Primary Examiner—David S Blum
(74) Attorney, Agent, or Firm—Sterne, Kessler, Goldstein & Fox P.L.L.C.

(57) ABSTRACT

An alignment target with geometry designs provides a desired alignment offset for processes (both symmetric and asymmetric) on a wafer substrate. The alignment target includes one or more sub-targets, where each sub-target is defined as having a left portion and a right portion having a different geometric pattern, and where the left portion has a geometry density and the right portion has a geometry density.

19 Claims, 10 Drawing Sheets

FOREIGN PATENT DOCUMENTS

| | | |
|---|---|---|
| JP | 4-186717 A | 7/1992 |
| JP | 7-066113 A | 3/1995 |
| JP | 7-226365 A | 8/1995 |
| JP | 9-022861 A | 1/1997 |
| JP | 11-083406 A | 3/1999 |
| JP | 11-102061 A | 4/1999 |
| JP | 2001-74606 A | 3/2001 |
| JP | 2003-303763 A | 10/2003 |

OTHER PUBLICATIONS

Final Rejection and Translation of Final Rejection for Japanese Patent Application No. 2004-318447, mailed Jan. 31, 2008, 5 pgs.

Translation of Office Action for Japanese Patent Application No. 2004-318447 drafted on Oct. 10, 2007, 5 pages.

Non-Final Rejection mailed Nov. 15, 2007, for U.S. Appl. No. 11/516,748, filed Sep. 7, 2006, 6 pgs.

Final Rejection mailed Mar. 18, 2008, for U.S. Appl. No. 11/516,748, filed Sep. 7, 2006, 7 pgs.

Second Non-Final Rejection mailed Aug. 7, 2008, for U.S. Appl. No. 11/516,748, filed Sep. 7, 2006, 7 pgs.

Notice of Allowance mailed Jan. 9, 2009, for U.S. Appl. No. 11/516,748, filed Sep. 7, 2006, 6 pgs.

Notice of Allowance mailed Jun. 12, 2006, for U.S. Appl. No. 10/696,355, filed Oct. 30, 2003, 6 pgs.

Notice of Reasons for Rejection mailed Apr. 19, 2010 for Japanese Patent Application No. 2004-318447, 10 pgs.

TUNABLE ALIGNMENT GEOMETRY

CROSS REFERENCE TO RELATED APPLICATIONS

This application is a divisional of U.S. patent application Ser. No. 11/516,748, filed Sep. 7, 2006, now U.S. Pat. No. 7,534,637, which is a divisional of U.S. patent application Ser. No. 10/696,355, filed Oct. 30, 2003, now U.S. Pat. No. 7,112,890), both of which are incorporated by reference herein in their entireties, as though set forth in full below.

BACKGROUND OF THE INVENTION

1. Field of the Invention

The present invention relates generally to alignment targets, and more specifically to semiconductor wafer alignment target(s) used in photolithography.

2. Related Art

The manufacture of semiconductor devices is primarily accomplished with photolithographic techniques. During the manufacturing process, multiple layers of a circuit pattern are built up on a semiconductor wafer. This is accomplished by projecting an image on a mask or reticle containing the circuit pattern onto a wafer coated with a photosensitive resist. Feature sizes imaged onto the semiconductor wafer are typically in the range of 0.15 microns or smaller. Due to the extremely small feature sizes and the requirement to expose multiple layers as part of the manufacturing process, the use of an alignment system to align the mask image on the semiconductor wafer is required. Often, the alignment accuracies necessary are in the range of 0.035 microns or less.

Generally, an alignment system includes a wafer having a wafer target thereon and a mask having a mask target thereon. The wafer target and mask target are aligned with respect to each other. In the manufacture of semiconductor wafers, processing variables such as wafer characteristics, number, thickness, and type of surface layers, often make alignment difficult. The variation in an alignment signal is a function of these processing variables and is referred to as process sensitivity. This process sensitivity often complicates the ability of an alignment system to accurately obtain the position of alignment marks (or targets) placed on a wafer.

Asymmetric processes also complicate the ability of an alignment system to accurately obtain the position of alignment targets placed on a wafer. Such asymmetric processes include (but are not limited to) chemical mechanical polishing (CMP) and deposition, both of which adversely affect alignment targets. Generally, CMP is an abrasive process used for polishing the surface of the semiconductor wafer flat. This process can be performed on both oxides and metals. CMP involves the use of chemical slurries and a circular (sanding) action to polish the surface of the wafer smooth. The smooth surface of the wafer is necessary to maintain photolithographic depth of focus for subsequent steps and also to ensure that aluminum interconnects are not deformed over contour steps. Deposition relates generally to the deposit of particles on the semiconductor wafer with known particle type, size and location.

Asymmetric processes cause great distress to the alignment community as most alignment systems have no way of detecting the asymmetry in an alignment target. What is needed is a way for allowing alignment systems to measure and model target asymmetry, as well as to custom design and/or tune target geometries, which can compensate for asymmetrical processes and produce a symmetric target and enhanced signal, or use the varying degrees of asymmetry forced by the target design to map the process.

SUMMARY OF THE INVENTION

The present invention provides a way for allowing alignment systems to measure and model target asymmetry, as well as to custom design and/or tune target geometries, which will either compensate for asymmetrical processes and produce a symmetric target and enhanced signal, or allow for the process effect to be modeled.

The present invention provides a method for using an alignment target configured to provide a desired alignment offset for a process on a wafer substrate including at least the following steps. Forming one or more sub-targets on the alignment target, such that the alignment target has a geometry design. Aligning an alignment system with respect to all of the one or more sub-targets. Using an algorithm to characterize the process and to calculate alignment of the alignment system.

The present invention also relates to an alignment target that includes a left portion having a geometry design and a comb like structure and a right portion having a geometry design and a comb like structure. The alignment target has a geometry design that provides a desired alignment offset for a process (symmetric or asymmetric) on a wafer substrate. The left and right portion can be included in one or more sub-targets of the alignment target. Each sub-target can be defined as having a left portion (e.g., edge) and a right portion (e.g., edge) having a different geometric pattern. The left portion and right portions can have similar or different geometry densities.

BRIEF DESCRIPTION OF THE FIGURES

The present invention will be described with reference to the accompanying drawings, wherein.

DETAILED DESCRIPTION OF THE PREFERRED EMBODIMENTS

A. Overview of the Invention

The present invention relates to techniques which use geometry variations in wafer target design to model, predict and compensate for asymmetric processes in the manufacture of semiconductor devices. Although the invention is described herein as it relates to asymmetric processes, the present invention may also be used for symmetric processes.

The invention involves alignment targets that are comprised of subsections of different designs. These subsections are specifically designed to be sensitive to asymmetric processes, including CMP and deposition, and to compensate for processing errors or anomalies within the alignment target. The invention may involve designing alignment targets where the outside vertical line (or edge) of a target is varied in width in order to measure changes in deposition and to correct alignment accordingly. The invention may also involve designing alignment targets where two portions (e.g., sides, edges, sections, etc.) of a target have varied widths in order to measure changes in deposition and to correct alignment accordingly.

The target design techniques of the present invention build on the knowledge that asymmetry (e.g., CMP and deposition) is the result of many complex forces, but is mainly controlled by line size and surrounding geometry. As line size increases, the asymmetric effect can likewise increase. Requirements of alignment systems can force a single period or line width to not be compatible with such asymmetric processes.

Utilizing "edges" instead of lines, in one embodiment, the present invention overcomes the errors associated with large geometries. Selectively segmenting an adjacent structure can increase the signal of a selected "edge", but can selectively adjust the effect of an asymmetric process.

Alignment targets of the present invention are comprised of subsections of different designs. For example, the geometry of the line edge of an alignment target may be formed into a comb like structure. Then, by adjusting the length, width and frequency of the "teeth" of the comb target, asymmetries can be identified and compensated. It is important to note that the target geometry of the present invention is not limited to comb like structures, but may also include checkerboard like structures, herringbone like structures, and so forth. The present invention may vary the width of the edge of an alignment target in order to measure changes in deposition and correct alignment. To facilitate the understanding of the present invention, a typical alignment system for use in semiconductor manufacturing and with the alignment target designs of the present invention will be described next with reference to FIG. 1.

B. Typical Alignment System For Use With The Present Invention

Figure 1:
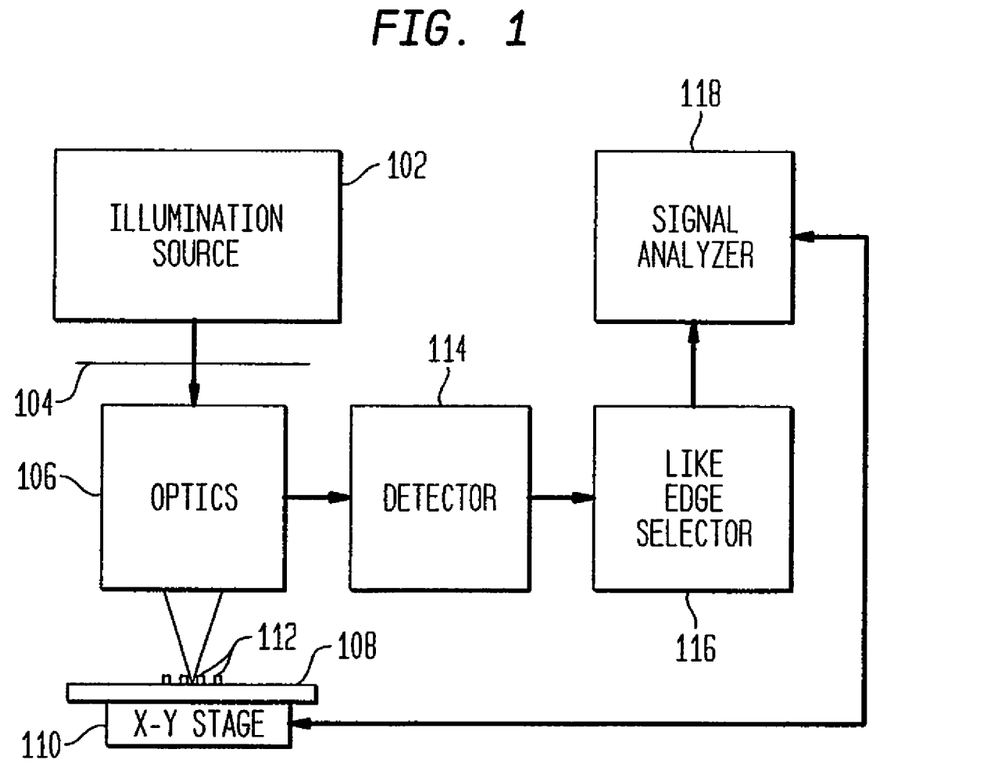
FIG. 1 illustrates an example of an alignment system for use in semiconductor manufacturing according to an embodiment of the invention.

FIG. 1 is a block diagram generally illustrating an alignment system for use in semiconductor manufacturing that may be utilized with the present invention. The alignment system shown in FIG. 1 matches pairs of like edges of alignment marks or targets. This alignment system is disclosed in U.S. Pat. No. 5,966,215, entitled "Line Width Insensitive Wafer Target Detection in Two Directions" to Markoya et al., which is herein incorporated by reference in its entirety. The alignment system is briefly discussed next with reference to FIG. 1.

The alignment system of FIG. 1 includes an illumination source 102, a reticle 104, optics 106, a semiconductor wafer 108, an X-Y stage 110, wafer alignment marks 112, a detector 114, a like edge selector 116, and a signal analyzer 118.

An illumination source 102 projects electromagnetic radiation through reticle 104 and optics 106 onto semiconductor wafer 108. Semiconductor wafer 108 has a plurality of wafer alignment marks 112 formed thereon. Wafer alignment marks 112 are generally lines formed by raised portions separated by a gap. However, trenches are also often used for alignment marks and may be used in place of raised portions. The wafer alignment marks 112 may be made by any conventional wafer fabrication process, and may be a grating.

Semiconductor wafer 108 is placed on the X-Y stage 110. X-Y stage 110 permits the semiconductor wafer 108 to be scanned with the electromagnetic radiation from illumination source 102. The electromagnetic radiation is imaged to form a predetermined illumination pattern, not shown. The predetermined illumination pattern is generally an X. However, any illumination pattern may be used that provides a detectable signal upon encountering a wafer alignment mark 112. The predetermined illumination pattern is created by a portion of a reticle or mask 104 through which the electromagnetic radiation from illumination source 102 passes.

Electromagnetic radiation reflected or scattered from the surface of wafer 108 and the wafer alignment marks 112 is collected by optics 106 and directed to detector 114. Detector 114 may be any detector capable of converting electromagnetic radiation into an electric signal. Detector 114 may also be positioned to collect reflected or scattered electromagnetic radiation from either side of wafer alignment marks 112. Multiple detectors 114 may be used positioned at different locations.

Like edge selector 116 is coupled to the detector 114. Like edge selector 116 selects like edges of pairs or sets of wafer alignment marks 112. Signals representative of the like edges selected by like edge selector 116 are analyzed by signal analyzer 118. Signal analyzer 118 uses any conventional signal analyzing technique to determine the location of like edges of wafer alignment marks 108. From this information, signal analyzer 118 determines the position of the wafer 108 and alignment of the wafer 108 and reticle 104. X-Y stage 110 is moved accordingly to achieve or maintain alignment.

As mentioned above, the present invention relates to techniques which use geometry variations in wafer target design to model, predict and/or compensate for asymmetric processes. The invention involves alignment targets that have subsections of different designs. These subsections are specifically designed to be sensitive to asymmetric processes and to identify for processing errors or anomalies within the alignment target. In an embodiment, the invention also involves designing alignment targets where the outside vertical line (or edge) of a target is varied in width in order to measure changes in deposition and to correct alignment accordingly.

C. Alignment Targets—Subsections of Different Designs

A geometry variation technique of the invention involves alignment targets that are comprised of subsections of different designs. Target geometries of the invention are illustrated herein as comb like structures. Target geometries of the present invention are not limited to comb like structures and the use of comb like structures for illustration is not meant to limit the invention. Examples of comb like structures (representing one edge of an alignment target) of the present invention are shown in FIG. 2.

Figure 2:
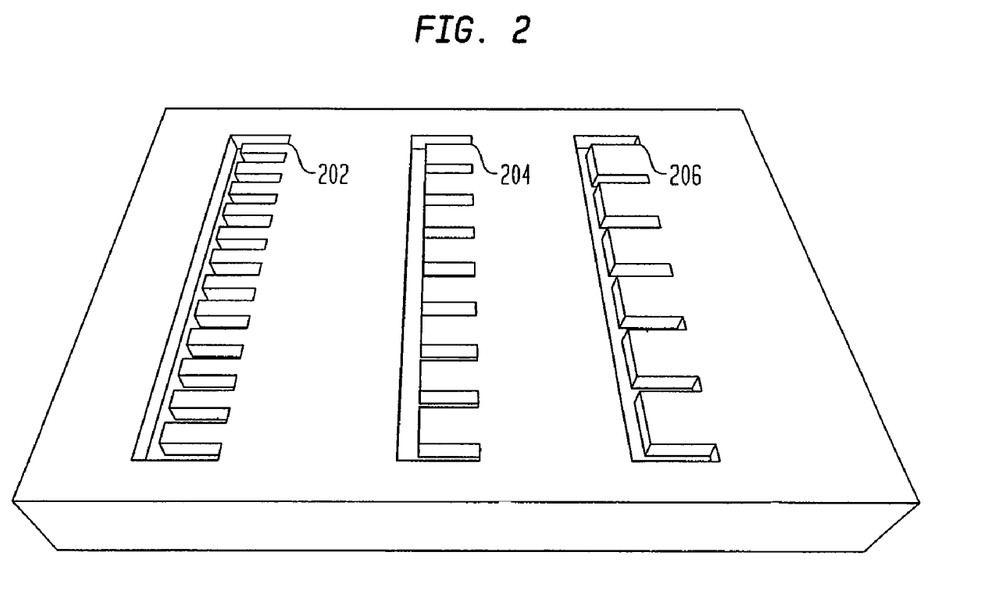
FIG. 2 illustrates three comb like structures or combs etched into a semiconductor substrate according to an embodiment of the invention.

FIG. 2 illustrates three comb like structures or combs 202 through 206 etched into a semiconductor substrate. As shown in FIG. 2, the frequency of the teeth of the combs 202 to 206 decreases as we move left to right from comb 202 to comb 206. Accordingly, as the frequency of the teeth of comb 202 to comb 206 decreases from left to right, the amount of surface area increases from left to right as we move from comb 202 to comb 206. The less surface area, the more contouring will occur. Thus, comb 202 will contour more than combs 204 and 206. Comb 204 will likewise contour more than comb 206.

Figure 3:
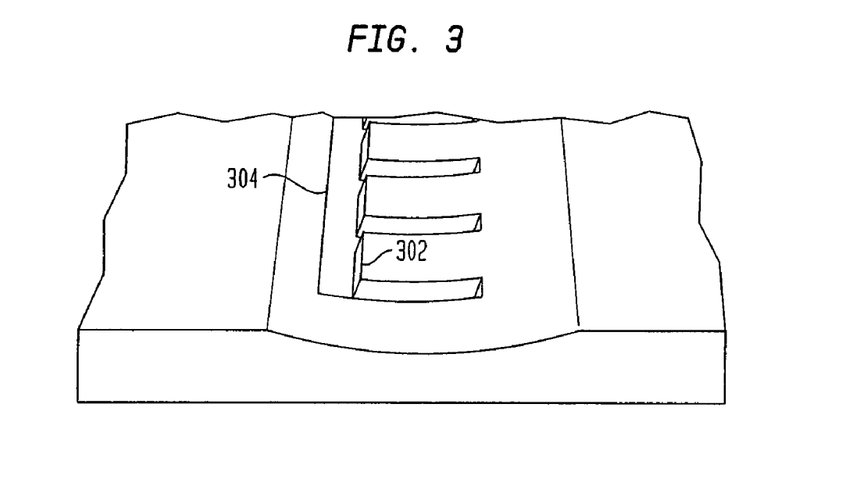
FIG. 3 illustrates that as the frequency of the teeth of the combs decreases from left to right, the amount of surface area increases from left to right according to an embodiment of the invention.

As stated above, as the frequency of the teeth of the combs decreases from left to right, the amount of surface area increases from left to right. The less surface area, the more contouring will occur. The more contouring that occurs, the more deformation and accordingly the less signal will be generated. This is illustrated with reference to FIG. 3. The ability to generate more signal is derived from a second parallel edge (or trailing edge "B") 302 in close proximity to the leading full "back of the comb" edge (or leading edge "A") 304. How the signal increases as the frequency of the teeth of the combs 202 through 206 (FIG. 2) decreases and how the signal is deflected due to the different surface area of the targets are further described with reference to FIG. 4.

Figure 4:
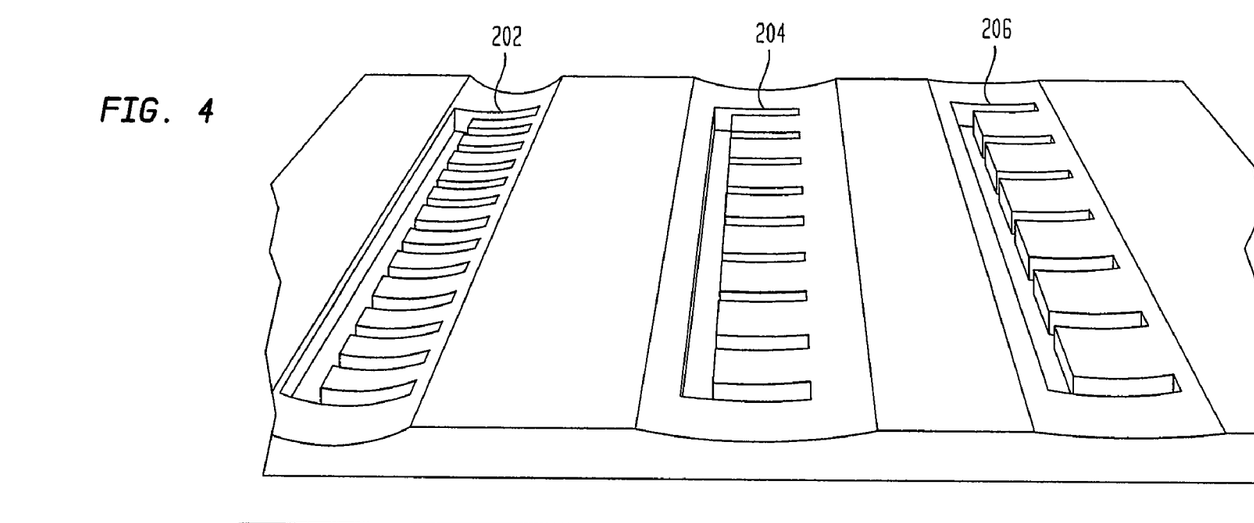
FIG. 4 illustrates how the signal increases as the frequency of the teeth of the combs decreases and how the signal is deflected due to the different surface area of the targets according to an embodiment of the invention.

FIG. 4 illustrates both signal generation (or resultant image shift from an alignment system source) and how a simple polish process in semiconductor manufacturing may affect the contouring of combs 202 through 206. Comb 202 with the least surface area is "dug" into the most, producing the largest surface deviation. Comb 204 is contoured, but less than comb 202 due to the spacing of its comb "teeth". This produces a smoother contour and a shallower angle to return the alignment system illumination. Comb 206 is least affected by the polish process because it has more surface area than combs 202 and 204. Thus, comb 206 provides more signal than the other combs 202 and 204 and its returned alignment signal will be the least displaced of the three combs 202 through 206.

As stated above, each example comb like structure illustrated in FIG. 2 represents one edge of an alignment target. A target of the present invention may consist of a right and left comb like structure (i.e., a single line target) (see FIG. 5) or may consist of multiple lines in the X direction and/or the Y direction (see FIGS. 8A and 8B) or in diagonal angles (see FIGS. 9A and 9B). FIGS. 8A, 8B, 9A and 9B will be discussed further below.

Figure 5:
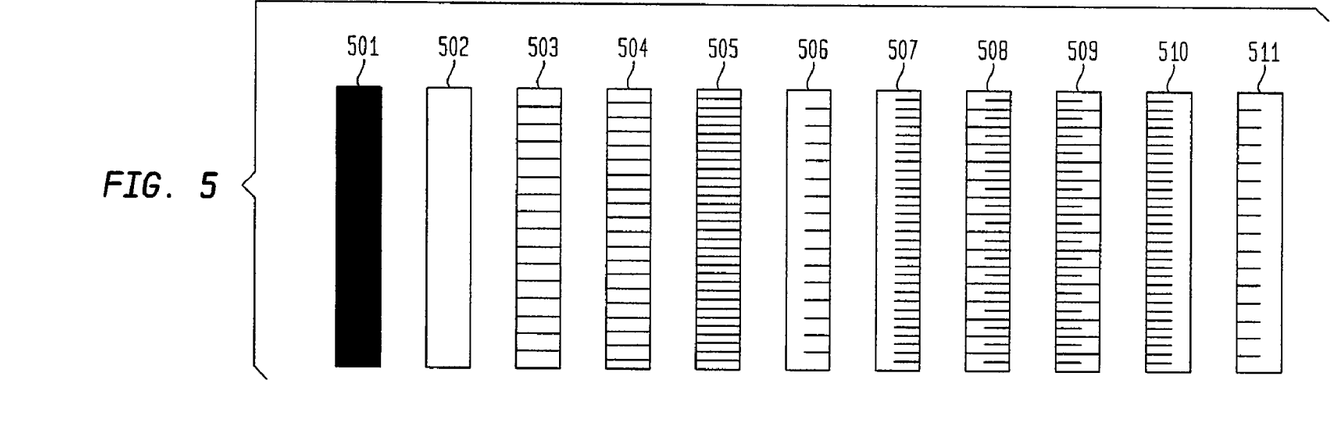
FIG. 5 illustrates single line target examples according to an embodiment of the invention.

FIG. 5 illustrates single line target examples 501 through 511 of the present invention. Targets 501 through 505 are symmetric in design (i.e., their right and left edges are mirror reflections of each other) and would produce a symmetric signal with a non-destructive process. Target 501 illustrates a simple well as its target geometry. In contrast to target 501, target 502 illustrates two thin lines as its target geometry. The designs of targets 501 through 505 are called "standard" because their left and right edges have the same geometry densities.

Targets 506 through 511 are asymmetric in design (i.e., their right and left edges are not mirror reflections of each other) and will produce an asymmetric signal with non-destructive processes. The designs of targets 506 through 511 are called "hybrid" because they have different geometry densities on the left and right edges of the target.

Targets 506 through 508 are biased, so a process will affect their right edges more than their left edges. Targets 509 through 511 are biased in the opposite direction from targets 506 through 508, so a process will affect their left edges more than their right edges. Targets 501 through 505 are not biased and thus a process should affect their right edges the same as their left edges.

The example alignment system described with reference to FIG. 1 can use the above information in several ways. First, depending on which geometry or pattern is etched into a wafer substrate, the alignment target and the alignment target's immediately surrounding area or geometry is shaped or contoured by some semiconductor processes. Second, polishing in particular will affect each target 501 through 511 differently as it selectively digs into the substrate where surface area or tension will allow. Less surface area will allow for more severe dishing of the target and its surrounding area, as is described further with reference to targets 501 through 511 and FIG. 6.

Figure 6:
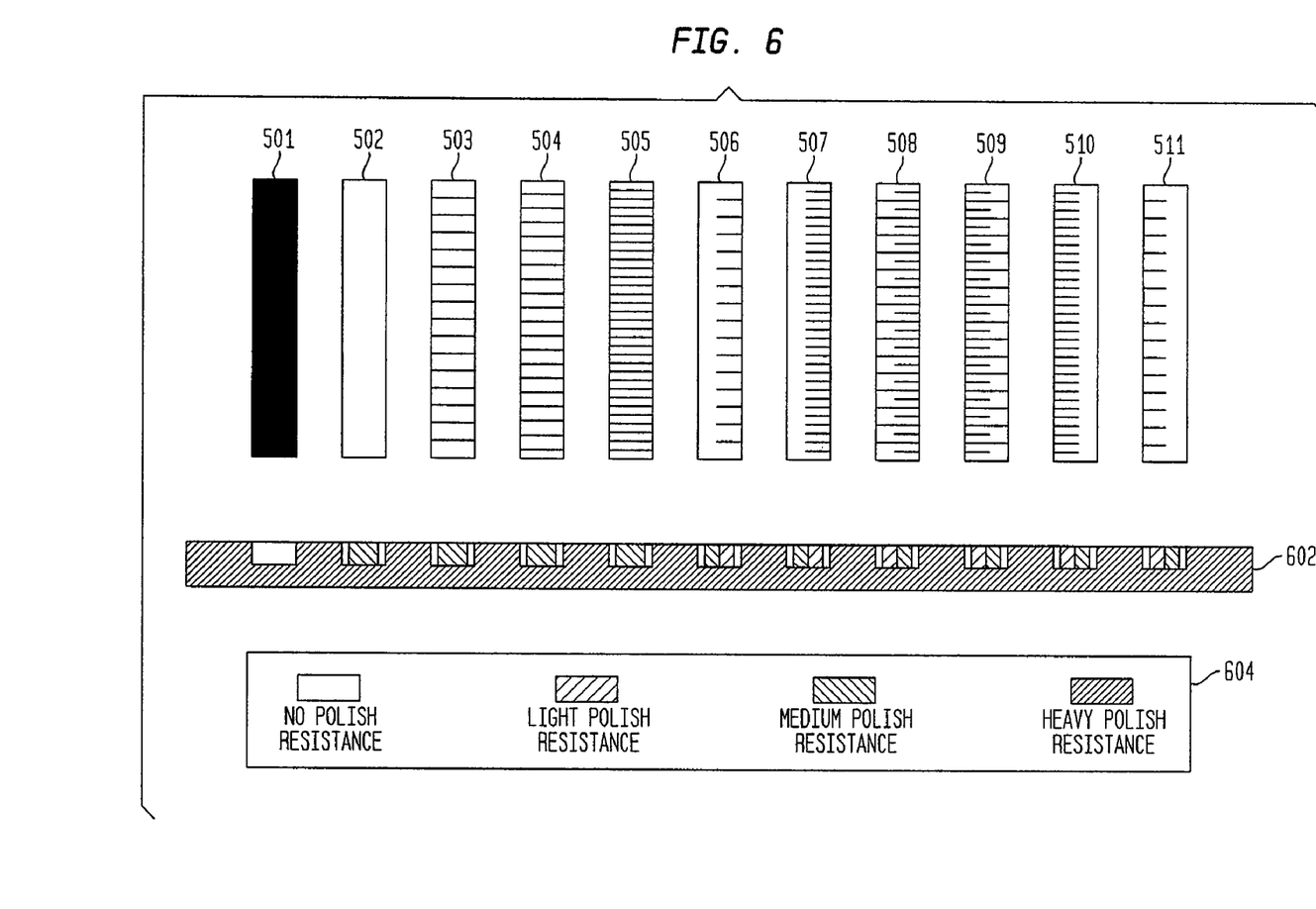
FIG. 6 illustrates wafer substrate susceptibility to the contouring process if example targets are etched into the wafer substrate according to an embodiment of the invention.

FIG. 6 illustrates wafer substrate susceptibility to the contouring process if targets 501 through 511 are etched into the wafer substrate. FIG. 6 illustrates a simple etched cross section 602 showing wafer substrate susceptibility to the contouring process. The etched cross section for each target 501 through 511 is illustrated directly below its respective target. It is important to note that cross section 602 is only an approximation. A legend 604 illustrates that the color white represents that the substrate offers no resistance to a polisher, a slightly darker color represents that the substrate offers light resistance to a polisher, a slightly darker color yet represents that the substrate offers medium resistance to a polisher and a dark grey color represents that the substrate offers the most resistance to a polisher. The color coding in legend 604 is for general purposes only and is not meant to represent the precise degree of resistance achieved through different comb tooth spacing or line width variation. The effects of this process can be subtle and there are a number of ways to compensate for resistance to a polisher, from subtle to radical.

Targets 501 through 505 are symmetric in design and thus both the left and right edges of targets 501 through 505 will have the same resistance to a polisher. This is shown in diagram 602 where the etched cross section for targets 501 through 505 have a consistent color across the entire cross section.

Targets 506 through 508 are asymmetric in design with their right edges having denser geometry than their left edges. Here, the right edges of targets 506 through 508 will have less resistance to a polisher than their left edges. This is shown in diagram 602 where the etched cross section for targets 506 through 508 have a lighter color on the right side of the cross section.

Targets 509 through 511 are also asymmetric in design with their left edges having denser geometry than their right edges. Here, the left edges of targets 509 through 511 will have less resistance to a polisher than their right edges. This is shown in diagram 602 where the etched cross section for targets 509 through 511 have a lighter color on the left side of the cross section.

Figure 7:
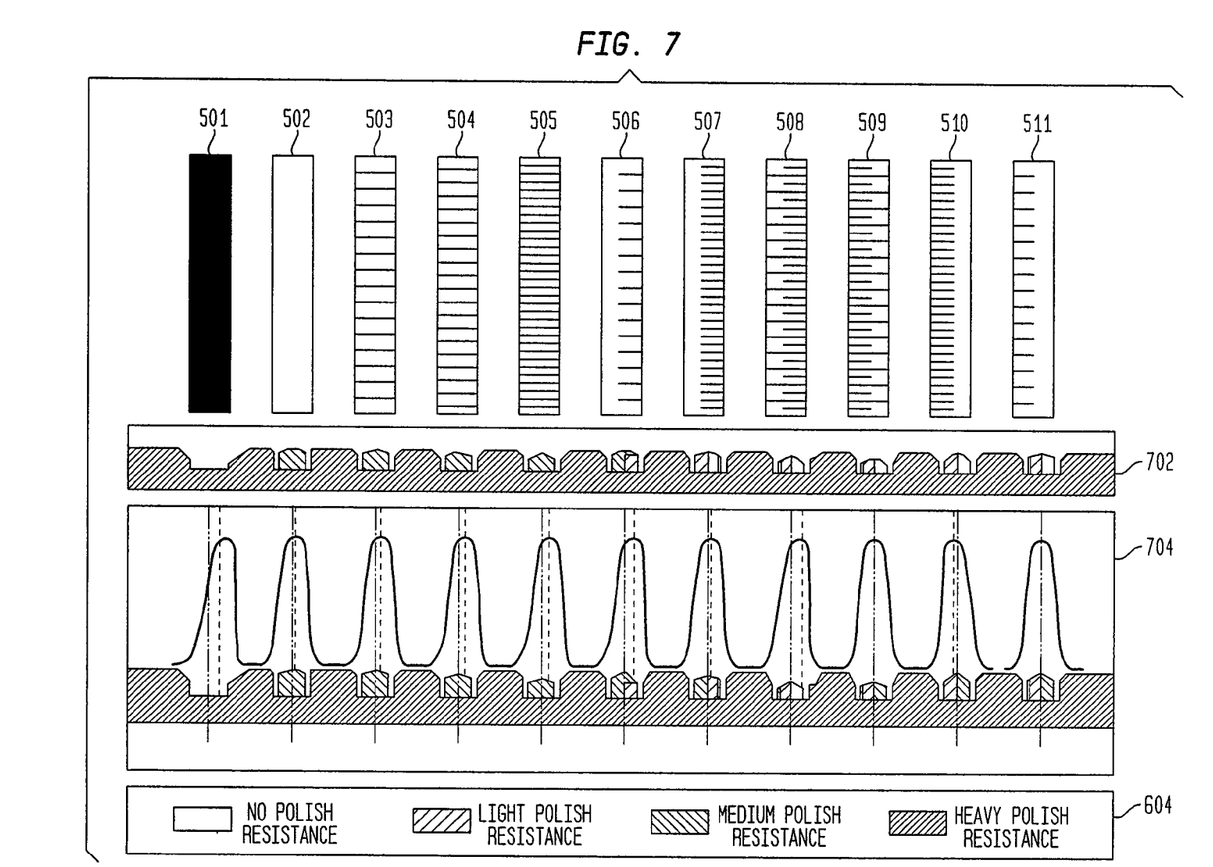
FIG. 7 illustrates the effect of a single asymmetric process (e.g., polish) on example targets where the process is biased towards the right edge of a given target according to an embodiment of the invention.

FIG. 7 is provided to help visualize the effect of a single asymmetric process (e.g., polish) on targets 501 through 511 where the process is biased towards the right edge of a given target. The basic technique utilized by the present invention is to simply contour the target based on the surface area (or geometry density) in the target design. By utilizing edges (left and right) different geometries could be used to affect those edges differently. It is possible to bias the body of a target and its left or right side to produce the same effect, which may be used in place of edge based designs. This technique can be used to overcome many symmetry programs of a given process. It is important to note that FIG. 7 is provided as an example only to illustrate the present invention and, in order to so, provide exaggerated pictorials to convey the concept. The actual alignment displacements/errors involved would range from tenths of microns to single nanometers.

FIG. 7 includes an example cross section profile 702 illustrating the contouring effect of the single polish process on targets 501 through 511, where the process is biased towards the right edge of a given target. Example cross section profile 702 illustrates what the polish process would do to the geometry of targets 501 through 511 in the "Z" or depth plane of the wafer. The cross section profile for each target 501 through 511 is illustrated directly below its respective target.

FIG. 7 also includes an example of target alignment signals 704. Target alignment signals 704 illustrate the alignment offset that would result from the single polish process to targets 501 through 511. In target alignment signals 704, the solid line represents the target centerline and the broken line represents the signal centerline. The alignment offset is the difference between the target centerline and the signal centerline. The target alignment signal for each target 501 through 511 is illustrated below its respective target. It is important to note that cross section profile 702 and target alignment signals 704 are only approximations and do not represent all of the subtleties that would be experienced by a wafer substrate after the single polish process has occurred.

Targets 501 through 511 are each discussed next with reference to its respective cross section profile and target alignment signal.

Target 501 is defined by a simple well as its target geometry. Therefore since target 501 has the least surface area of all of the targets shown, it also displays the largest alignment offset. The right edge of target 501 is polished further and at a different angle from its left edge, producing a signal with the maximum alignment offset from its target centerline.

Target 502 is defined by two thin lines as its target geometry. Target 502 has the most surface area of all of the targets shown, and thus produces a signal with the minimum alignment offset from its target centerline.

Targets 503 through 505 are all symmetric and thus will react similar to the process as target 502, except that the surface area to protect the targets from the process decreases with the addition of geometry in increasing intervals. Thus, in targets 503 through 505, there is a shift in the alignment offset which increases as the surface area diminishes. The polisher will dig in selectively as the surface area is reduced.

Targets 506 and 507 have a bias on their right side (this is the problem side or polish prone side in this example) which will bias the target to the right. The alignment offset (or displacement) of the target and signal centerlines in both targets 506 and 507 is helped some by having only a single line target on their left edges which offers a fair amount of protection to the left and center of these two targets. This protection prevents the signal centerline from being deflected further from the target centerline in both targets 506 and 507.

Target 508 is also biased in on its right side and thus will bias the target to the right. Target 508 has additional left edge contouring geometry which will result in its deflection of its signal centerline from its target centerline which produces a larger alignment offset than what was shown with targets 506 and 507.

Targets 509 through 511 are simply inversions of targets 506 through 508. Here, the difference is that the target geometry in targets 509 through 511 will contour the target to identify the processing error more so than what was shown in targets 506 through 508.

Target 509 utilizes right edge geometry to identify the process error in this example. By increasing the geometry density of (reducing the surface area on) its left edge and by having medium geometry density on its right edge, the process becomes symmetric and thus produces a signal with no alignment offset for target 509.

Target 511 produces the basic same result as just described with target 509, but more so because its geometry is less dense. Thus, the polish process will dig in less and should still result in a symmetric signal with no alignment offset for target 511.

Target 510 has geometry that is biased in the proper direction for the sample process, but too strongly, and the resultant alignment offset is overcorrected. Target 510 is the only case where the resultant alignment offset is in the opposite direction. The offset occurs due to the process contouring the target too far left.

The basic technique utilized by the present invention is to simply contour the target based on the geometry (or surface area) found in the target design. By utilizing edges (left and right) different target designs could be used to affect those edges differently. This technique can be used to overcome many symmetry programs of a given process, including but not limited to CMP.

Figure 8A:
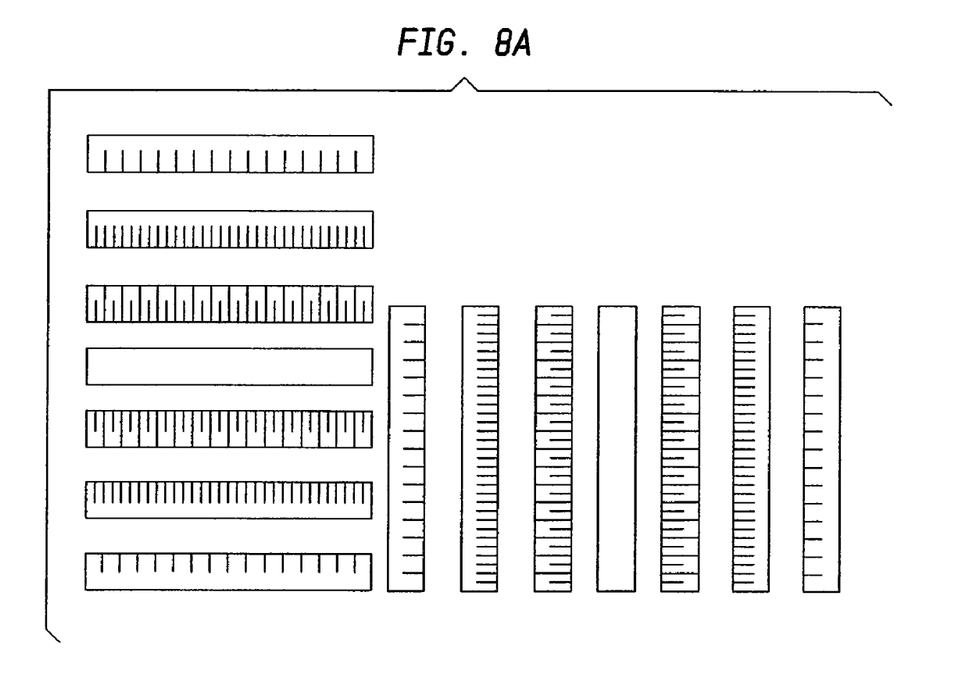
FIG. 8A illustrates example hybrid sub-targets according to an embodiment of the invention (X+Y)
Figure 8B:
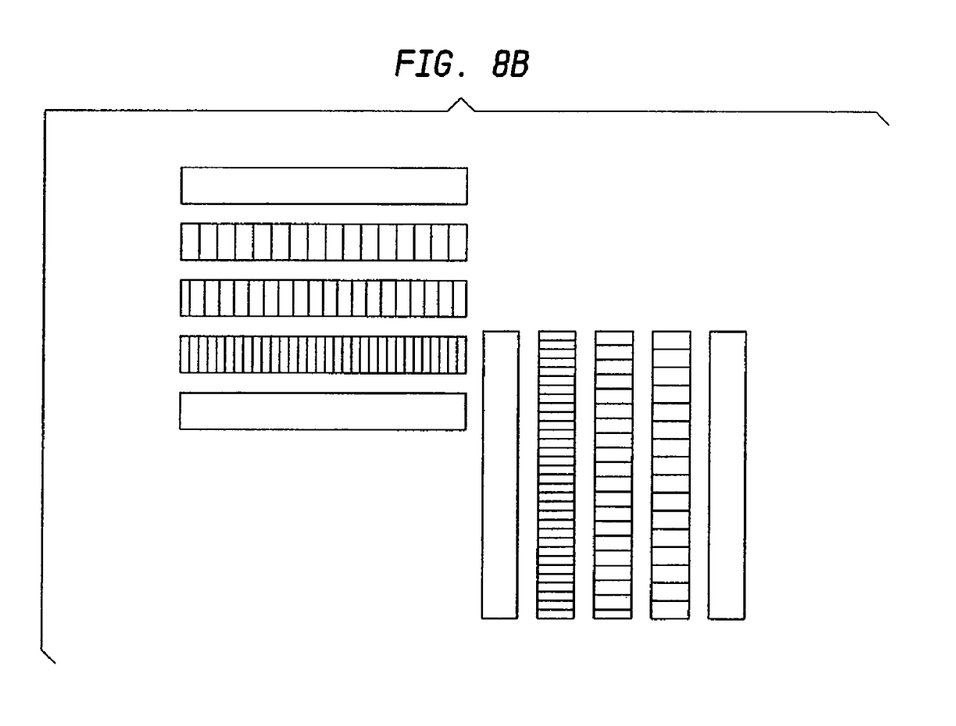
FIG. 8B illustrates example standard sub-targets according to an embodiment of the invention (X+Y)
Figure 9A:
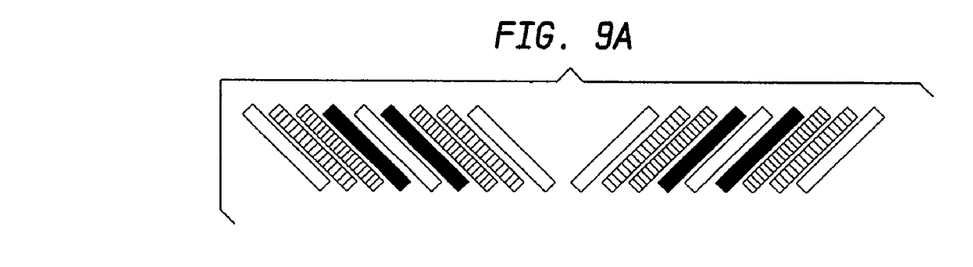
FIGS. 9A and 9B illustrate example targets of the present invention that have multiple single line targets arranged in diagonal angles.
Figure 9B:
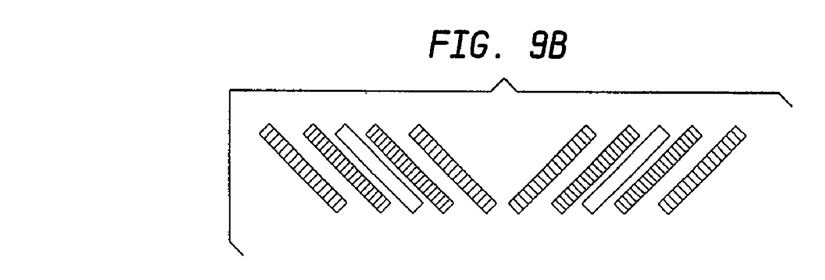

As stated above, a target of the present invention may consist of a right and left comb like structure (i.e., a single line target) as illustrated in FIG. 5 or may consist of multiple lines of sub-targets in the X direction and/or the Y direction or in diagonal angles. FIGS. 8A and 8B illustrate example targets of the present invention that consist of multiple single lines of sub-targets arranged in the X and Y directions. FIG. 8A consists of hybrid sub-targets, whereas FIG. 8B consists of standard sub-targets. Using standard design sub-targets allow for a smaller physical overall target design. Using hybrid design sub-targets allows for more absolute references to the least biased geometry. FIGS. 9A and 9B illustrate example targets of the present invention that consist of multiple single line targets arranged in diagonal angles. Both FIGS. 9A and 9B consist of standard sub-targets. It is clear that there is an infinite variety of targets that can be created using the techniques of the present invention. For example, by clever segmentation, one can even design a single target which contains X and Y alignment information. Then, by using segments in the linewidth period desired for the alignment system, Y information could be gleaned from an X target.

Figure 10:
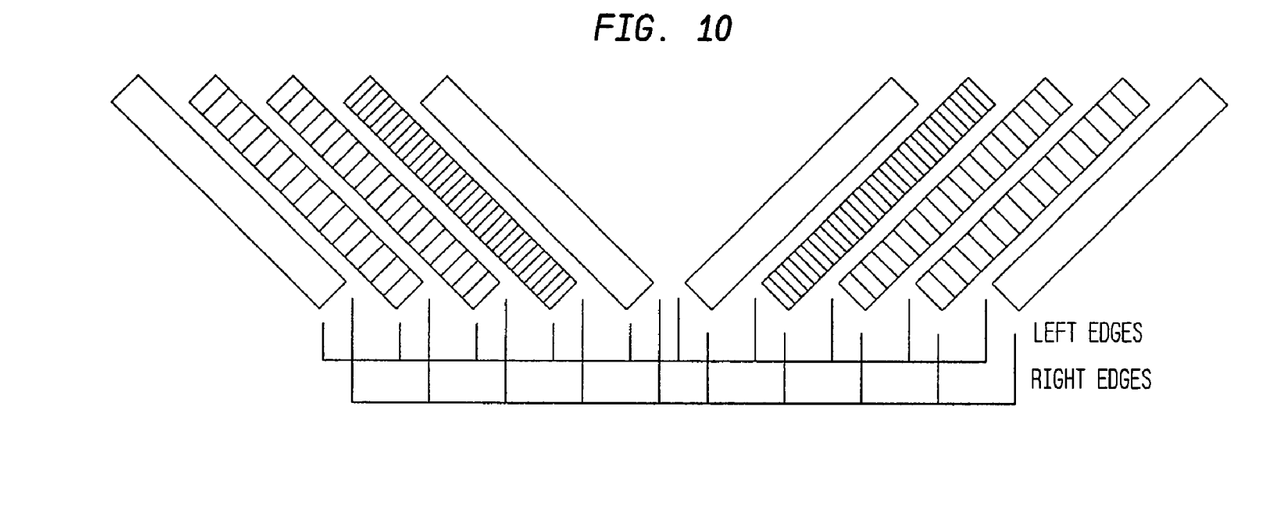
FIG. 10 illustrates alignment targets of the present invention that can be designed to separate left and right edges enough to independently measure the line position of different line types.

D. Utilization of Edge Detectors with the Alignment Targets of the Present Invention The target design techniques presented herein offer advantages in a number of ways. First, by utilizing "edges" instead of lines, the present invention overcomes the errors associated with large geometries. Second, by selectively segmenting an adjacent structure, not only can one increase the signal of a selected "edge", but selectively adjust the effect of an asymmetric process. These techniques of the invention are illustrated further with reference to FIG. 10. Alignment targets of the present invention can be designed to separate left and right edges enough to independently measure the line position of different line types. This helps to determine the process bias easily. The particular target design illustrated in FIG. 10 is designed to work with a 45 degree illumination, but right angled illuminations could be also be used. Here, since all edges of the sub-targets can be measured independently, no hybrid targets are required to determine the process offset (although hybrid targets are not precluded from being used).

Various techniques that can be used with the targets of the present invention work to reduce or eliminate the alignment offsets associated with asymmetric processing in a number of ways. First and the most simple, is that if a process is relatively consistent then a single line target design that compensates for the process could be identified and used.

Another technique option includes target designs that cover biases of both sides of the target and thus would cancel an error by averaging the total geometry.

Yet another technique option includes utilizing a single line target as a reference target. Deltas could then be measured between the reference target and other left/right edges and compared to the known actual positions of the targets on the reticle which they are printed from. Since the surface area of the adjacent targets is known by the target design, the displacement errors will allow for the characterization of the process and its effects to the target position as a whole.

Figure 11A:
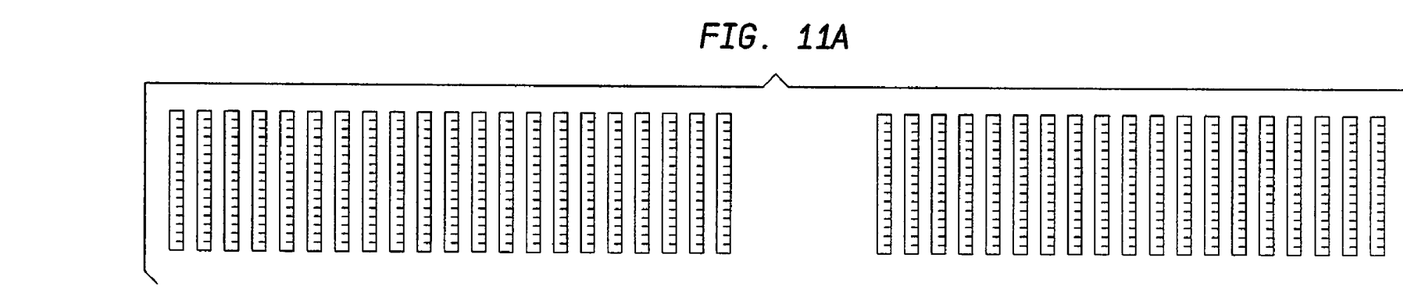
FIG. 11A illustrates an example alignment target that could be utilized to induce or correct for process alignment offsets according to an embodiment of the invention.

E. Utilization of Phase Grating Detectors with the Alignment Targets of the Present Invention Phase grating detectors do not work on left or right edges of targets independently but can still benefit from the targets described herein of the present invention. First, if a process is known then the properly designed target could be used for the grating to compensate for the process effect. This concept is further illustrated with reference to FIG. 11A. FIG. 11A illustrates an example alignment target that could be utilized to induce or correct for process alignment offsets. The example target shown in FIG. 11A can be used on a single grating or on multiple gratings. Multiple gratings offer the advantage of using one or the other grating as a reference to measure any possible process effects.

Additionally, by utilizing different target designs within a single grating one can minimize a process effect by averaging errors. This averaging of error may be achieved via the use of symmetric designed targets of the present invention. This concept is further illustrated with reference to FIG. 11B. The example target shown in FIG. 11B will result in a better alignment than a simple offset since the targets of the present invention are more process robust and therefore minimize errors. The example target shown in FIG. 11B can also be used on a single grating or on multiple gratings, as described above with reference to FIG. 11A.

Figure 11B:
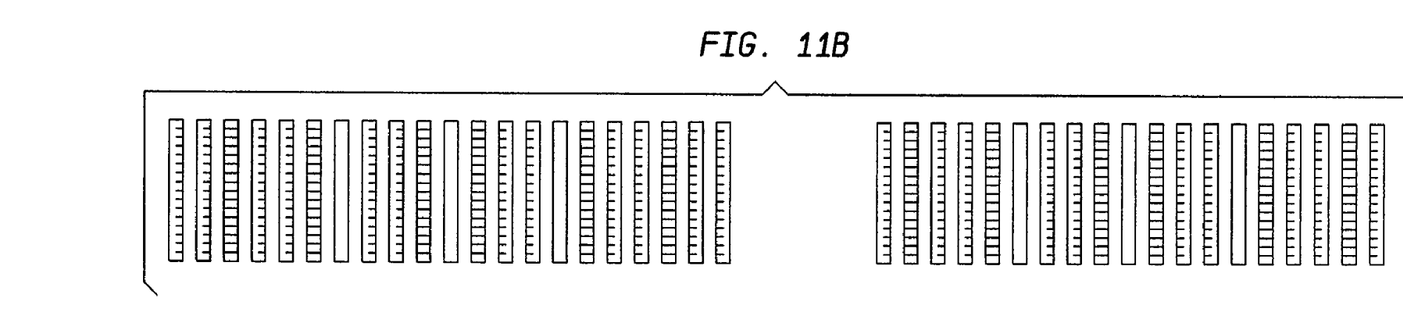
FIG. 11B illustrates an example alignment target that will result in a better alignment than a simple offset according to an embodiment of the invention.
Figure 11C:
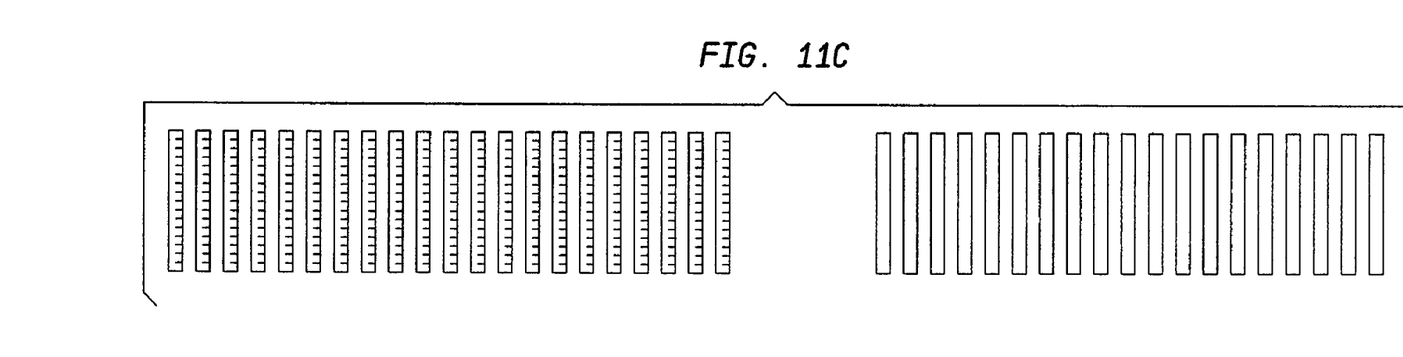
FIG. 11C illustrates an example alignment target of the invention that works to induce process induced offsets.

In addition, by utilizing different targets for different gratings the absolute positions of the targets can be measured and compared to determine the process effect as explained above with reference to edge detectors. This concept is further illustrated with reference to FIG. 11C. The example target in FIG. 11C works to induce process induced offsets. One can then measure the offset based on the grating positions. By calculating the process effect on known surface area differences of the target, the actual process bias can be determined. This type of target requires multiple gratings that differ from one another. Additional gratings (greater than two as shown in FIG. 11C) can further characterize the process and act to better guarantee the proper solution.

In summary, with the large number of sub-target sections in a grating based target, the present invention offers an infinite number of possible target designs. Depending on certain processes, different designs may offer different benefits. The example targets illustrated in FIGS. 11A-11C are only used to illustrate the invention and are not meant to be limiting. For example, the example targets illustrated in FIGS. 11A-11C can be extended further to cover target designs which enhance different orders of return signals or multiple orders of return signals.

F. Alignment Targets—Varying Edge Widths

The present invention also involves designing alignment targets where the outside vertical line (or edge) of a target is varied in width in order to measure changes in deposition and to correct alignment accordingly. Here, by designing the outside vertical line edge of the target geometry to also vary in width, a deposition generated asymmetry can be detected and modeled. It is important to note that it is possible that "comb" will do this all on its own. The wider values may be needed to enhance and therefore better predict the effect. A basic target design of the present invention is illustrated in FIG. 12.

Figure 12:
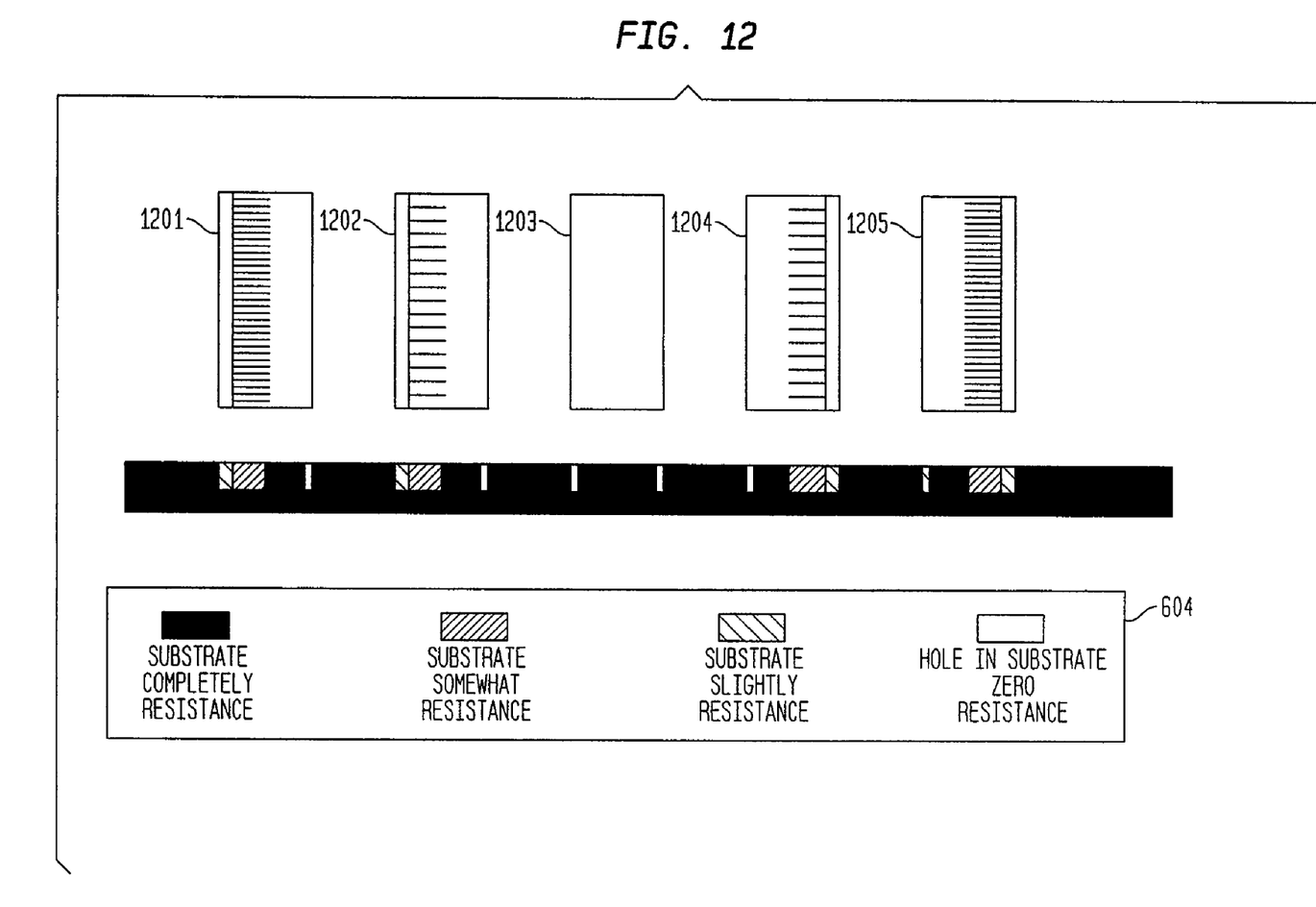
FIG. 12 illustrates one technique of the present invention where alignment targets are designed in such a way so that the outside vertical line (or edge) of a target is varied in width in order to measure changes in deposition combined with varying surface content and to correct alignment accordingly.

In FIG. 12, a target comprised of five sub-targets 1201 through 1205 is shown. Also shown in FIG. 12 is a simple etched cross section 1206 showing wafer substrate susceptibility to the contouring process. The etched cross section for each sub-target 1201 through 1205 is illustrated directly below its respective sub-target. A legend 1208 illustrates that the color white offers no resistance to a polisher and thus is the most recessed and damaged. Other colors shown in legend 1208 illustrate slight resistance to a polisher; somewhat resistance to a polisher and complete resistance to a polisher (having the darkest color). The color coding in legend 1208 is for general purposes only and is not meant to represent the precise degree of selectivity achieved through different comb tooth spacing or line width variation. The effects of this process can be subtle and there are a number of ways to compensate from subtle to radical.

As shown in FIG. 12, the line edge of the comb side of the sub-targets 1201 through 1205 are also variable. By increasing the line width of these line edges or trenches, one can to some degree control the amount of an asymmetric deposition. Since asymmetric depositions are largely directional, opening the line width of the sub-targets in increments will change the amount of the asymmetry, thereby allowing one to produce data that characterizes and compensates for the asymmetry. In practice, since the targets would by design appear with each field printed, then by aligning to several points on a wafer one would use the produced data to characterize a process. Thus, one could use this produced data to prove the effect of a process on alignment without resorting to thin film removing techniques.

G. Operation of the Present Invention

Figure 13:
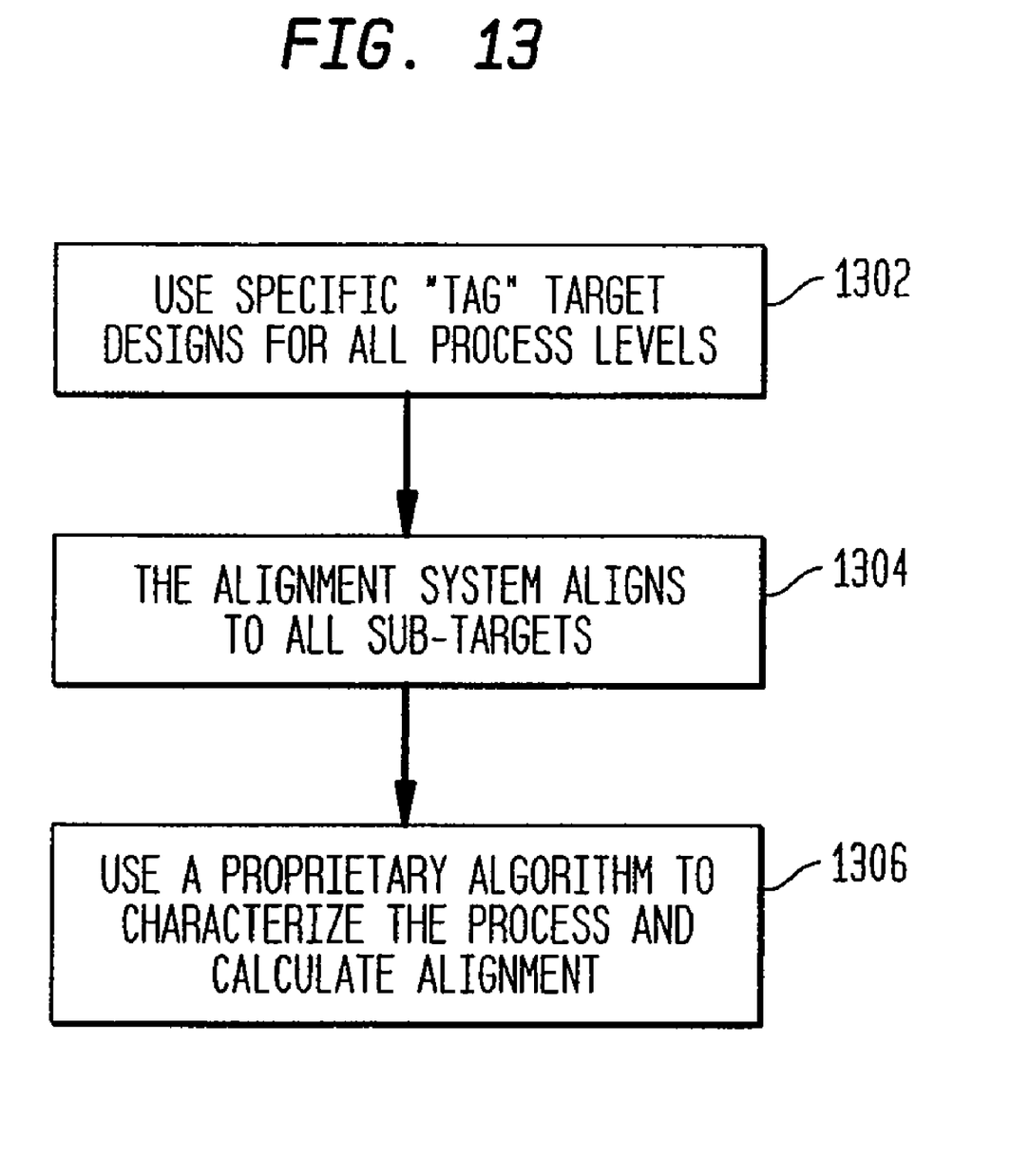
FIG. 13 is a flowchart that illustrates an example operation that utilizes the target designs of the present invention according to an embodiment of the invention.

FIG. 13 illustrates an example operation that utilizes the target designs of the present invention in order to model, predict and identify process error in the manufacture of semiconductor devices. The flowchart in FIG. 13 is not meant to limit the invention but only to provide an illustrative example of the operation of the invention. The flowchart in FIG. 13 starts at step 1302, where specified "TAG" target designs are used for all process levels. In step 1304, the alignment system aligns to all sub-targets of the target. Finally, in step 1306, a proprietary algorithm is used to characterize the process and calculate alignment.

H. Conclusion

While various embodiments of the present invention have been described above, it should be understood that they have been presented by way of example, and not limitation. It will be apparent to persons skilled in the relevant art that various changes in form and detail may be made therein without departing from the spirit and scope of the invention. This is especially true in light of technology and terms within the relevant art(s) that may be later developed. Thus, the present invention should not be limited by any of the above-described exemplary embodiments, but should be defined only in accordance with the following claims and their equivalents.

What is claimed is:

1. A method, comprising:
   forming a sub-target on an alignment target, such that the alignment target has a configurable geometry design;
   reflecting a beam of radiation from the sub-target incident at a first angle;
   determining an offset based on the reflected light beam; and
   generating data based on the determined offset to model target asymmetry; and
   tuning the configurable geometry design based on the modeled target asymmetry.

2. The method according to claim 1, further comprising using an asymmetric process for the forming step.

3. The method according to claim 2, further comprising using a chemical mechanical polishing (CMP) process for the asymmetric process.

4. The method according to claim 2, wherein in the forming step, the asymmetric process is a deposition process.

5. The method according to claim 1, wherein the forming step is a symmetric process.

6. The method of claim 1, further comprising using one or more subsections of different designs as the geometry design.

7. The method of claim 1, further comprising determining the desired offset based on a difference between a target centerline and a signal centerline.

8. The method of claim 1, further comprising using a checkerboard structure or a herringbone structure for the geometry design for the alignment target.

9. The method of claim 1, wherein the aligning step comprises aligning the alignment system with respect to all of the one or more sub-targets.

10. A method to align a mask and a substrate, comprising:
    contouring a first alignment target on a substrate based on a corresponding geometry of one or more constituent structures;
    illuminating the first alignment target with a beam of radiation;
    determining one or more alignment offsets between a geometric centerline of the first alignment target and a geometric centerline of the beam after a reflection from the first alignment target; and
    altering a subsequent geometry of a second alignment target on the substrate based on the determining step.

11. The method of claim 10, further comprising:
    repeating the contouring, illuminating, determining, and altering in a first direction until the mask and the substrate are accurately aligned.

12. The method of claim 11, further comprising:
    performing the contouring, illuminating, determining, and altering in a second direction corresponding to the repeating step.

13. The method of claim 10, wherein the altering comprises:
    altering at least one of a frequency and a surface area of said one or more constituent structures of the first and the second alignment targets.

14. The method of claim 10, further comprising:
    using a periodically repeating comb like structure, a checkerboard structure or a herringbone structure for determining the one or more geometric offsets.

15. The method of claim 10, further comprising:
    polishing the substrate to selectively create digs into the substrate for the first and the second alignment target.

16. A method of alignment in photolithography, comprising:
    reflecting a beam of radiation at a first angle from at least one sub-target of a geometrically configurable alignment target;
    receiving the reflected beam to selectively measure or model target asymmetry by determining an alignment offset in at least one of a process on a substrate, target geometry and an alignment signal based on the reflected beam; and
    tuning the target geometry of the geometrically configurable alignment target based on the measured or modeled target asymmetry.

17. The method according to claim 16, further comprising:
    forming the at least one sub-target on the geometrically configurable alignment target by using an asymmetric process.

18. The method according to claim 17, using an asymmetric process further comprising:
    using at least one of a chemical mechanical polishing (CMP) process or a deposition process.

19. The method according to claim 16, further comprising:
    forming the at least one sub-target on the geometrically configurable alignment target by using a symmetric process.

* * * * *